United States Patent
Yu et al.

(10) Patent No.: US 10,811,580 B2
(45) Date of Patent: Oct. 20, 2020

(54) PIXEL ARRAY SUBSTRATE INCLUDING FLUX STRUCTURE LAYER FOR IMPROVING LED CONTACT AND METHOD OF MANUFACTURING THEREOF

(71) Applicant: Au Optronics Corporation, Hsinchu (TW)

(72) Inventors: Fang-Cheng Yu, Taipei (TW); Cheng-Yeh Tsai, Taipei (TW)

(73) Assignee: Au Optronics Corporation, Hsinchu (TW)

(*) Notice: Subject to any disclaimer, the term of this patent is extended or adjusted under 35 U.S.C. 154(b) by 20 days.

(21) Appl. No.: 16/183,719

(22) Filed: Nov. 7, 2018

(65) Prior Publication Data
US 2019/0181317 A1    Jun. 13, 2019

(30) Foreign Application Priority Data
Dec. 13, 2017    (TW) .............................. 106143799 A

(51) Int. Cl.
*H01L 33/62*    (2010.01)
*H01L 25/075*    (2006.01)

(52) U.S. Cl.
CPC .......... *H01L 33/62* (2013.01); *H01L 25/0753* (2013.01); *H01L 2224/18* (2013.01); *H01L 2224/81* (2013.01); *H01L 2933/0066* (2013.01)

(58) Field of Classification Search
CPC . H01L 33/62; H01L 25/0753; H01L 27/1248; H01L 27/1266
See application file for complete search history.

(56) References Cited

U.S. PATENT DOCUMENTS

| | | |
|---|---|---|
| 7,604,154 B2 | 10/2009 | Matsumoto et al. |
| 8,349,116 B1 | 1/2013 | Bibl et al. |
| 8,518,204 B2 | 8/2013 | Hu et al. |
| 8,573,469 B2 | 11/2013 | Hu et al. |
| 9,147,812 B2 | 9/2015 | Andrews |
| 9,240,396 B2 | 1/2016 | Fan et al. |
| 9,487,678 B2 | 11/2016 | Namiki et al. |

(Continued)

FOREIGN PATENT DOCUMENTS

| | | |
|---|---|---|
| CN | 1579698 | 2/2005 |
| CN | 10593298 | 4/2016 |

(Continued)

*Primary Examiner* — Matthew E. Gordon
(74) *Attorney, Agent, or Firm* — JCIPRNET

(57) ABSTRACT

A pixel array substrate has a plurality of sub-pixel regions, wherein a pixel structure of an individual sub-pixel region includes a first signal line, a second signal line, a first contact pad, a second contact pad, a light-emitting diode, a first conductive structure, and a flux structure layer. The first contact pad and the second contact pad are respectively electrically connected with the first signal line and the second signal line. The light-emitting diode is disposed on the first contact pad. A portion of the first conductive structure is disposed between the first contact pad and a first electrode of the light-emitting diode. The flux structure layer partially surrounds the first conductive structure and the light-emitting diode. A top portion of the flux structure layer is higher than a top surface of the first electrode and is lower than a bottom surface of a light-emitting layer of the light-emitting diode.

9 Claims, 8 Drawing Sheets

(56) References Cited

U.S. PATENT DOCUMENTS

| | | |
|---|---|---|
| 9,831,228 B2 | 11/2017 | Yen |
| 9,965,112 B2 | 5/2018 | Nah et al. |
| 10,141,287 B2 | 11/2018 | Zou et al. |
| 2005/0056687 A1 | 3/2005 | Matsumoto et al. |
| 2007/0221712 A1 | 9/2007 | Matsumoto et al. |
| 2013/0126081 A1 | 5/2013 | Hu et al. |
| 2013/0130440 A1 | 5/2013 | Hu et al. |
| 2015/0084054 A1 | 3/2015 | Fan et al. |
| 2015/0353781 A1 | 12/2015 | Namiki et al. |
| 2016/0034066 A1 | 2/2016 | Nah et al. |
| 2017/0170160 A1* | 6/2017 | Yen .................. H01L 24/83 |
| 2017/0330867 A1* | 11/2017 | Zou ................ H01L 25/0753 |
| 2018/0190876 A1* | 7/2018 | Liu .................... H01L 33/62 |
| 2018/0224974 A1 | 8/2018 | Nah et al. |
| 2019/0164854 A1* | 5/2019 | Liu .................. H01L 21/288 |

FOREIGN PATENT DOCUMENTS

| | | |
|---|---|---|
| CN | 106887188 | 6/2017 |
| TW | 201504389 | 2/2015 |
| TW | 201513317 | 4/2015 |
| TW | 201604737 | 2/2016 |
| TW | I559572 | 11/2016 |
| TW | 201721831 | 6/2017 |
| WO | 2013074370 | 5/2013 |
| WO | 2013074372 | 5/2013 |

\* cited by examiner

PIXEL ARRAY SUBSTRATE INCLUDING FLUX STRUCTURE LAYER FOR IMPROVING LED CONTACT AND METHOD OF MANUFACTURING THEREOF

CROSS-REFERENCE TO RELATED APPLICATION

This application claims the priority benefit of Taiwan application serial no. 106143799, filed on Dec. 13, 2017. The entirety of the above-mentioned patent application is hereby incorporated by reference herein and made a part of this specification.

BACKGROUND

Technical Field

The invention relates to a pixel array substrate, and more particularly, to a pixel array substrate having a flux structure layer.

Description of Related Art

Currently, in common liquid crystal displays, the light-emitting diode (LED) plays the role of providing a backlight source, and can use a liquid crystal as a light switch. With the progress of science and technology, display technology has gradually changed from backlighting to self-luminescence. Micro-LED displays further have the advantages of high brightness, low power consumption, high resolution and high color saturation.

However, there are still many technical bottlenecks to be overcome in the development of micro-LED displays, among which the most important is "Mass Transfer" technology. Mass transfer technology is the technology transferring micro light-emitting diodes from the growth substrate to the pixel array substrate. Due to the simultaneous transfer of a large number of micro light-emitting diodes, the micro light-emitting diode alignment accuracy is particularly important. In the prior art, micro light-emitting diodes often shift during transposition, resulting in that the micro light-emitting diodes on the pixel array substrate cannot function normally. Therefore, there is a need for a solution to the aforementioned problems.

SUMMARY

The invention provides a pixel array substrate which may increase the probability that the micro light-emitting diodes are electrically connected with the contact pads correctly.

The invention provides a manufacturing method of a pixel array substrate which may increase the probability that the micro light-emitting diodes are electrically connected with the contact pads correctly.

A pixel array substrate of the invention has a plurality of sub-pixel regions, wherein a pixel structure of an individual sub-pixel region includes a first signal line, a second signal line, a first contact pad, a second contact pad, a light-emitting diode, a first conductive structure, and a flux structure layer. The first signal line and the second signal line are disposed on the substrate. The first contact pad and the second contact pad are respectively electrically connected with the first signal line and the second signal line. The light-emitting diode is disposed on the first contact pad. The light-emitting diode includes a first semiconductor layer, a second semiconductor layer, a light-emitting layer, and a first electrode. The light-emitting layer is disposed between the first semiconductor layer and the second semiconductor layer. The first electrode is disposed between the first semiconductor layer and the first contact pad. At least a portion of the first conductive structure is disposed between the first contact pad and the first electrode. The flux structure layer at least partially surrounds the first conductive structure and the light-emitting diode in a projection direction perpendicular to the substrate. The flux structure layer has a top portion, and the top portion is higher than a top surface of the first electrode and is lower than a bottom surface of the light-emitting layer.

A manufacturing method of a pixel array substrate of the invention includes: providing a substrate having a plurality of sub-pixel regions, wherein each of the sub-pixel regions has a first contact pad and a second contact pad thereon; forming a first conductive material separately on each of the first contact pads; forming a flux material layer on the substrate, and the flux material layer at least partially covers each of the first conductive materials, wherein the flux material layer has a softening temperature lower than the melting temperature of the first conductive material; disposing a plurality of light-emitting diodes on the flux material layer, wherein the light-emitting diodes respectively correspond to each of the first conductive materials on each of the first contact pads; heating the substrate so as to bring the flux material layer to the softening temperature; heating the substrate to bring each of the first conductive materials to the melting temperature to form a first conductive structure. Each of the first conductive structures is electrically connected with the first electrode of a corresponding light-emitting diode, wherein each of the first conductive structures is electrically connected with a corresponding first contact pad.

One of the objectives of the invention is to increase the probability that the light-emitting diodes are electrically connected with the contact pads correctly.

One of the objectives of the invention is to reduce the problem of light reflections in the pixel area and further improve the display quality.

To make the aforementioned features and advantages of the invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
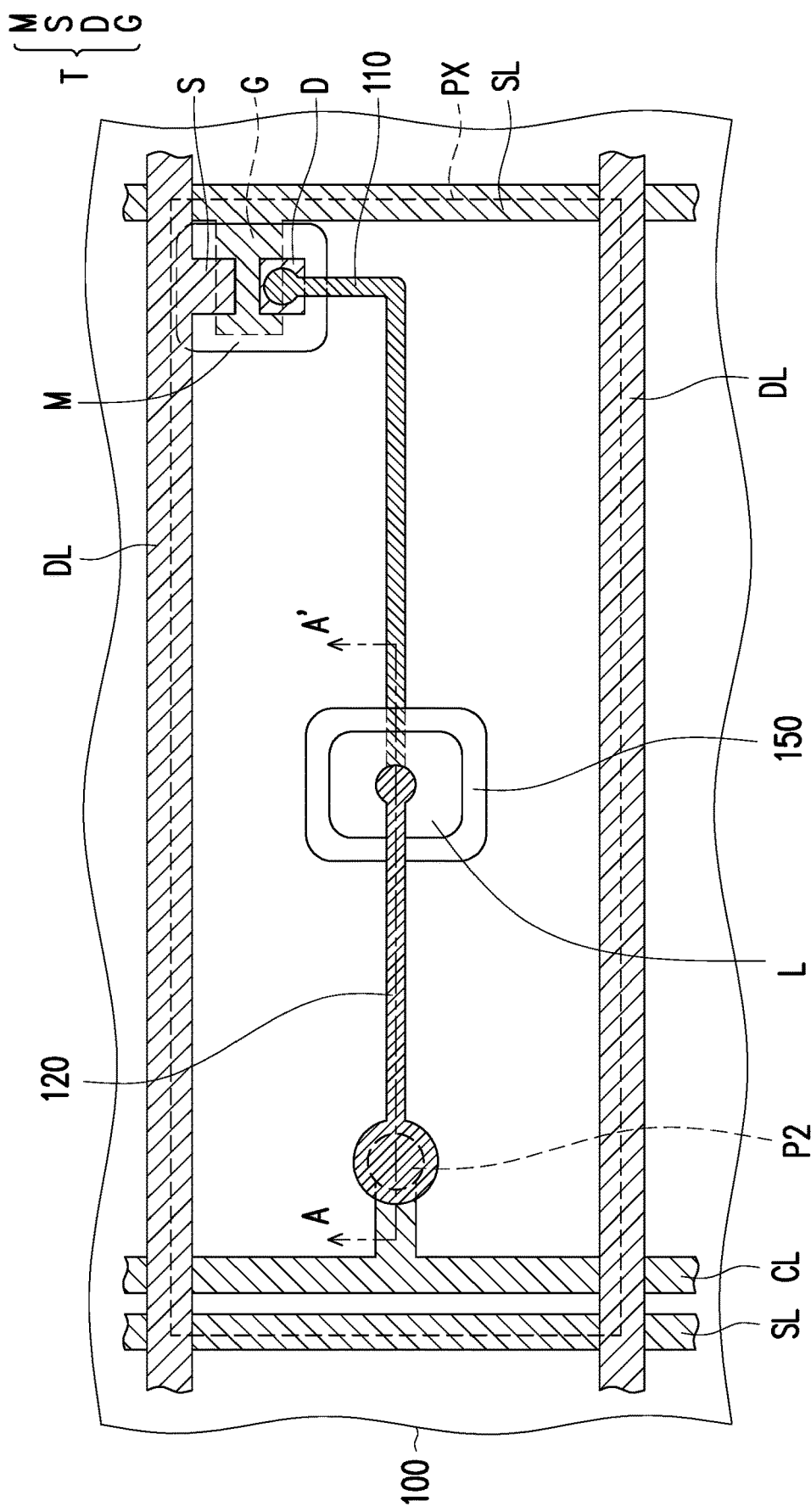
FIG. 1 is a schematic top view of a pixel array substrate according to an embodiment of the invention.

FIG. 1 is a schematic top view of a pixel array substrate 10 according to an embodiment of the invention. FIGS.

2A-2G are schematic cross-sectional views showing a manufacturing process of a pixel array substrate according to an embodiment of the invention. For example, FIGS. 2A-2G are schematic views of the manufacturing process in view of the cross-section of line AA' of FIG. 1. In FIG. 1, some components are omitted.

Referring to FIG. 1, the pixel array substrate 10 includes a substrate 100. The substrate 100 has a sub-pixel region PX, and a pixel structure is disposed within the sub-pixel region PX. Although FIG. 1 shows only one sub-pixel region PX, the invention is not limited thereto. The substrate 100 actually includes a plurality of sub-pixel regions PX. The range of the single sub-pixel region PX is defined by two adjacent transmission lines having the same function and two adjacent conductive wires having the same function, and the transmission lines and the conductive wires respectively extend along different directions. In this embodiment, the range of the single sub-pixel region PX is defined by two adjacent scan lines SL, and two adjacent data lines DL.

Figure 2A:
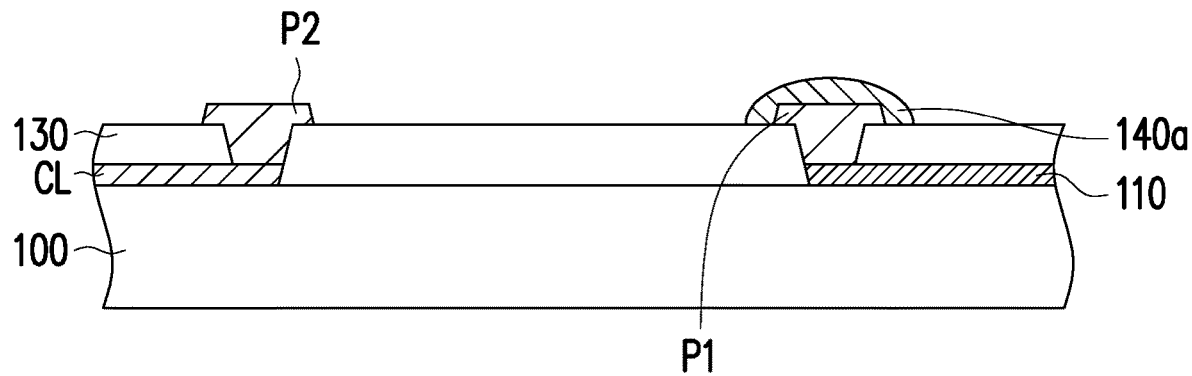
FIGS. 2A-2G are schematic cross-sectional views showing a manufacturing process of a pixel array substrate according to an embodiment of the invention.
Figure 2B:
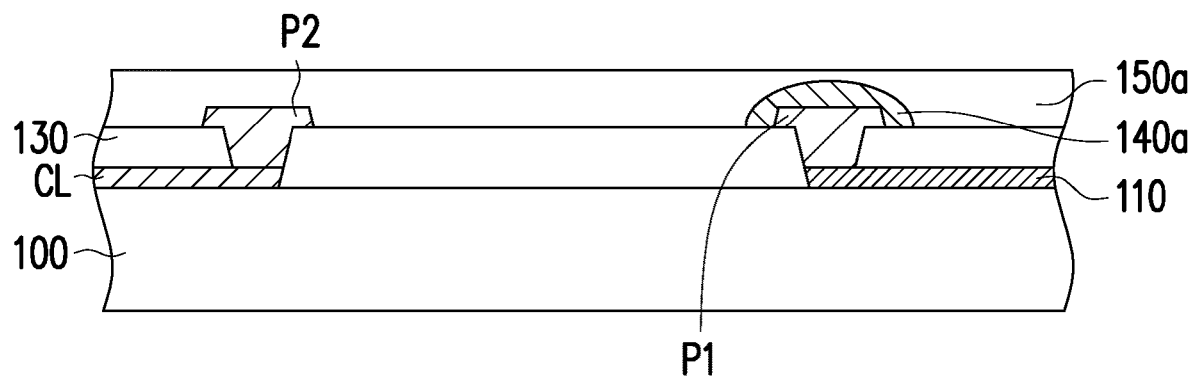
Figure 2C:
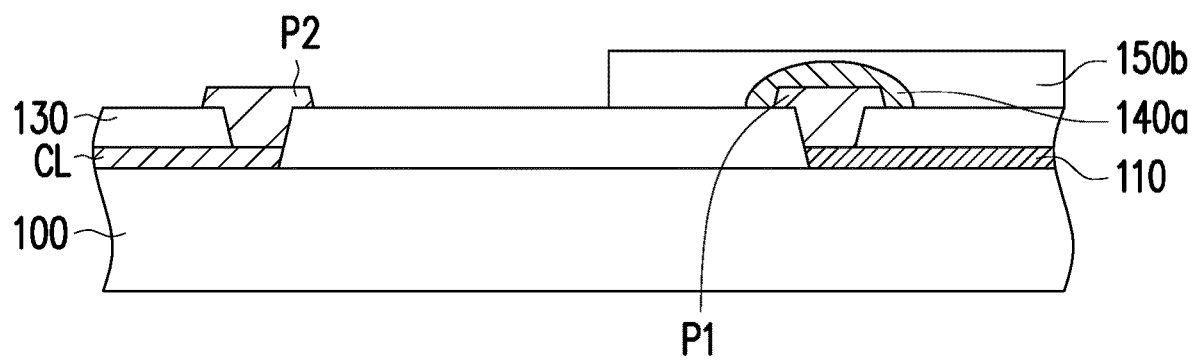
Figure 2D:
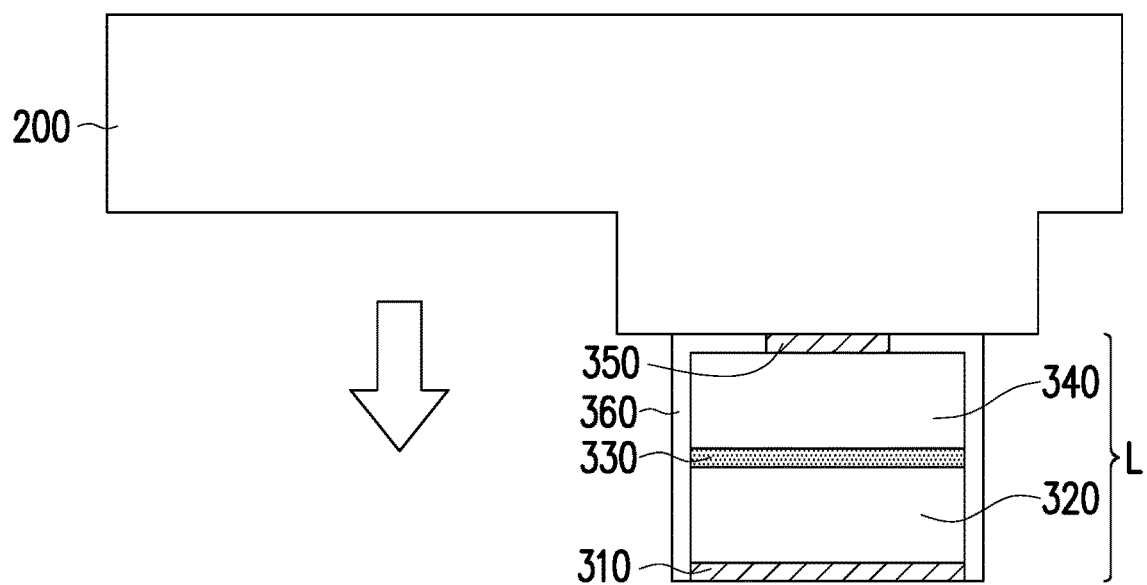
Figure 2D:
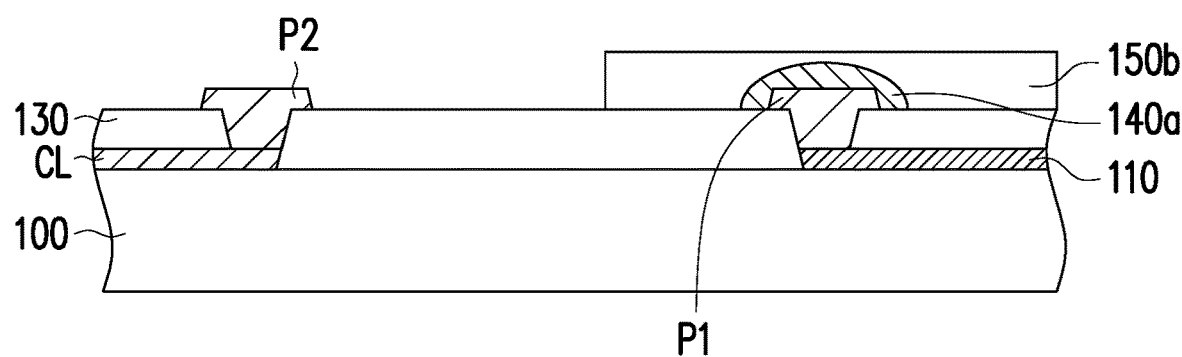
Figure 2E:
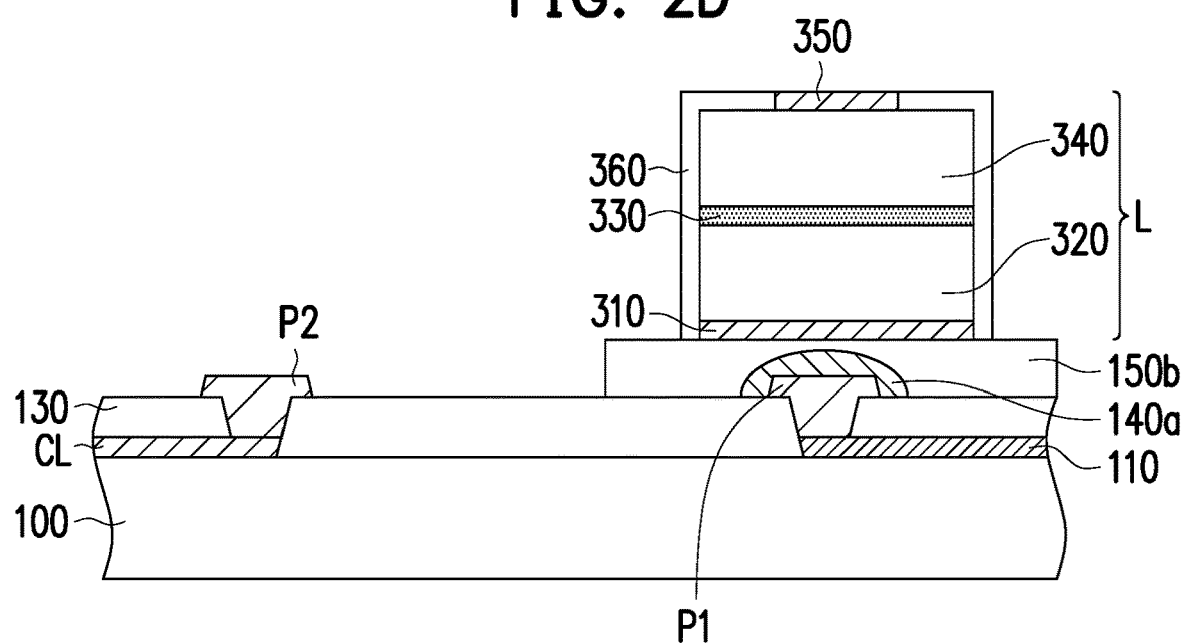
Figure 2F:
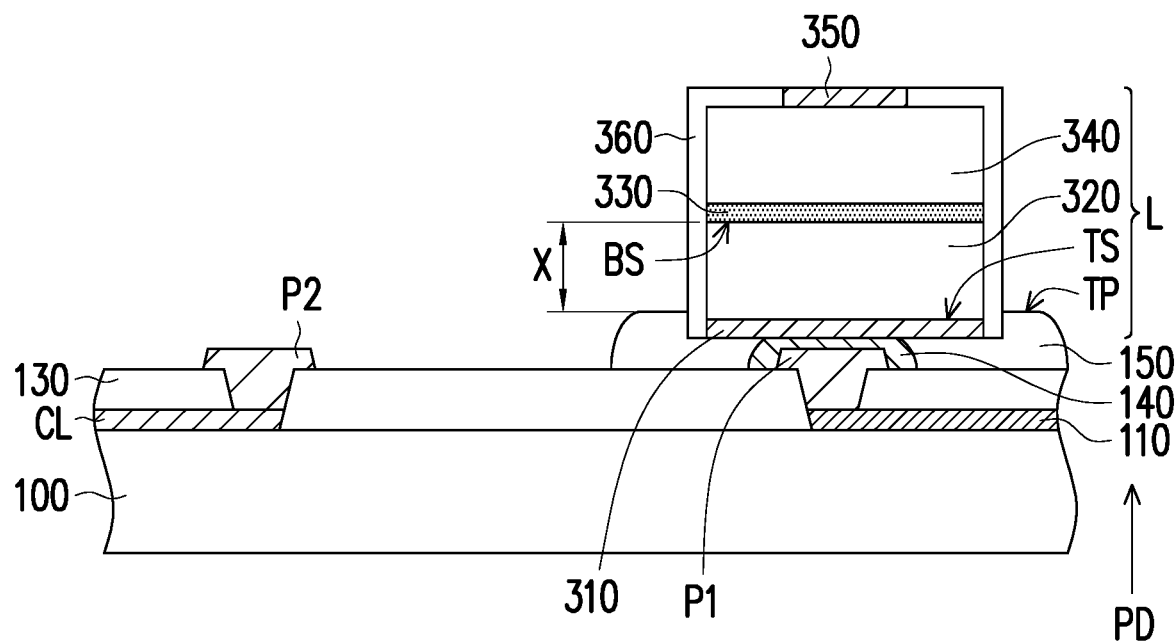
Figure 2G:
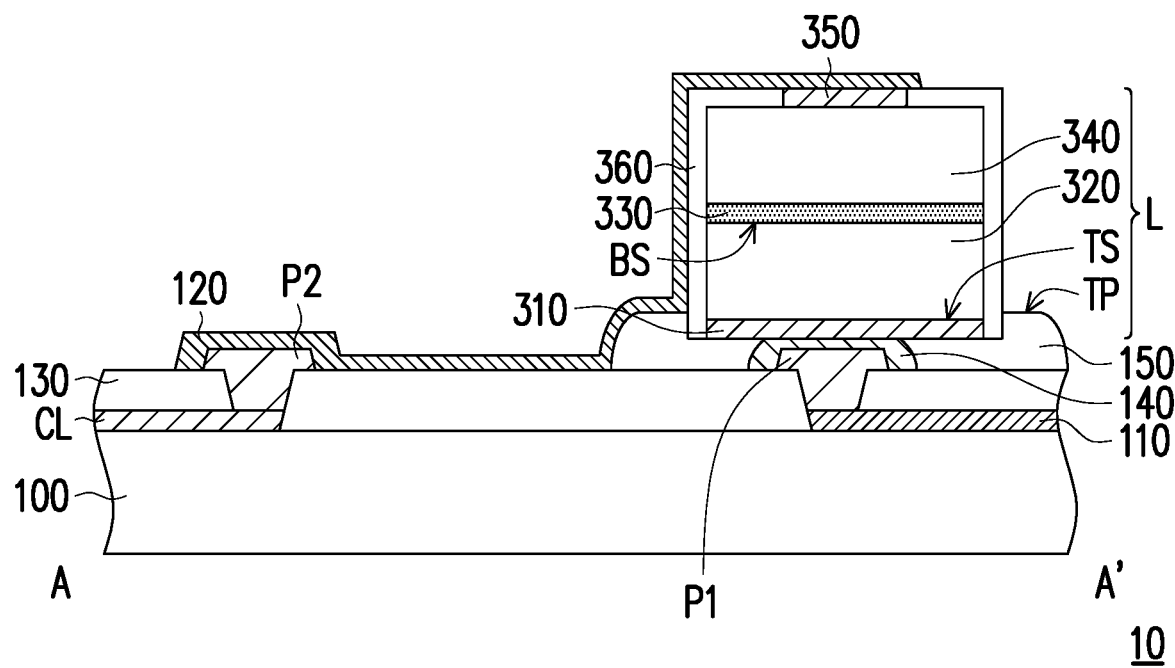

Referring to both of FIG. 1 and FIG. 2G, the pixel structure on the sub-pixel region PX includes a switching element T, a first signal line 110, a second signal line CL, a first contact pad P1 (shown in FIG. 2G), a second contact pad P2, a light-emitting diode L, a first conductive structure 140 (shown in FIG. 2G), and a flux structure layer 150.

The switching element T is disposed on the substrate 100 and includes a gate G, a channel layer M, a source S, and a drain D. A gate insulating layer (not shown) is sandwiched between the gate G and the channel layer M, and the gate G is electrically connected with the scan line SL. In this embodiment, the gate G and the corresponding scan line SL are integrally formed, but the invention is not limited thereto. The source S and the drain D are electrically connected with the channel layer M. The source S is electrically connected with the data line DL. Although the switching element T takes a bottom-gate thin film transistor in which the gate G is disposed between the channel layer M and the substrate 100 as an example in this embodiment, the invention is not limited thereto. The switching element T may also be a top-gate thin film transistor in which the channel layer M is disposed between the gate G and the substrate 100 or another type of switching element.

The first signal line 110 and the second signal line CL are disposed on the substrate 100. In this embodiment, the second signal line CL and the scan line SL may be the same film layer, and formed under the same patterning process. However, the invention is not limited thereto. The second signal line CL may also be other additional conductive film layers. The first signal line 110 is electrically connected with the drain D. In some embodiments, the first signal line 110 and the drain D may also be the same film layer, and formed under the same patterning process. The first contact pad P1 (shown in FIG. 2G) and the second contact pad P2 are respectively electrically connected with the first signal line 110 and the second signal line CL. The first contact pad P1 and the second contact pad P2 may be formed under the same or different patterning process.

Referring to FIG. 2G, a light-emitting diode L is disposed on the first contact pad P1. The light-emitting diode L includes a first semiconductor layer 320, a second semiconductor layer 340, a light-emitting layer 330, a first electrode 310, and a second electrode 350.

Referring to FIG. 2A first, the first signal line 110 and the second signal line CL are disposed on the substrate 100, and an insulating layer 130 covers the first signal line 110 and the second signal line CL. The first signal line 110 and the second signal line CL are respectively electrically connected with the first contact pad P1 and the second contact pad P2 through the openings in the insulating layer 130. In some embodiments, there may be other insulating layers between the first signal line 110 and the substrate 100 and/or between the second signal line CL and the substrate 100. The invention does not limit the first signal line 110 and the second signal line CL to be in direct contact with the substrate 100. In some embodiments, there may be other insulating layers between the first signal line 110 and the insulating layer 130 and/or between the second signal line CL and the insulating layer 130. The invention does not limit the first signal line 110 and the second signal line CL to be in direct contact with the insulating layer 130. In some embodiments, the first signal line 110 and the second signal line CL may be formed in different processes. That is, the first signal line 110 and the second signal line CL may respectively belong to different conductive film layers.

A first conductive material 140a is separately formed on each of the first contact pads P1. The methods of forming the first conductive material 140a includes, for example, solder plating, printing or other suitable methods.

Referring to FIG. 2B, a flux material layer 150a is formed on the substrate 100, and the flux material layer 150a at least partially covers the first conductive material 140a, wherein the softening temperature of the flux material layer 150a is lower than the melting temperature of the first conductive material 140a.

Referring to FIG. 2C, a patterning process is performed on the flux material layer 150a, and the remaining flux material layer 150b is not overlapping with each other the second contact pad P2. In some embodiments, the method of performing the patterning process on the flux material layer 150a includes a lithography process and an etching process, but the invention is not limited thereto. In some embodiments, the flux material layer 150a includes a photosensitive polymer material, and the flux material layer 150a can be patterned without an additional etching process.

Referring to FIG. 2D and FIG. 2E, a plurality of the light-emitting diodes L are disposed on the flux material layer 150b. The light-emitting diodes L respectively correspond to the first conductive material 140a on the first contact pad P1.

The light-emitting diode L includes a first electrode 310, a first semiconductor layer 320, a light-emitting layer 330, a second semiconductor layer 340, and a second electrode 350. In this embodiment, the first electrode 310, the first semiconductor layer 320, the light-emitting layer 330, the second semiconductor layer 340, and the second electrode 350 are sequentially stacked. The first electrode 310 is disposed on the first semiconductor layer 320. The light-emitting layer 330 is disposed between the first semiconductor layer 320 and the second semiconductor layer 340. The second electrode 350 is disposed on a side of the second semiconductor layer 340 opposite to the light-emitting layer 330, and the second semiconductor layer 340 is disposed between the second electrode 350 and the light-emitting layer 330. An insulating layer 360 covers the side surfaces of the first electrode 310, the first semiconductor layer 320, the light-emitting layer 330, the second semiconductor layer 340, and the second electrode 350.

In this embodiment, the light-emitting diode L is, for example, formed on a growth substrate (not shown). Next, the light-emitting diode L is lifted from the growth substrate by a pickup array 200, and then the light-emitting diode L is transferred onto the first contact pad P1. In some embodiments, after the light-emitting diode L is lifted from the growth substrate, and before the light-emitting diode L is transferred onto the first contact pad P1, the light-emitting diode L is transferred onto other transitional substrate. In some embodiments, the method of lifting the light-emitting diode L from the growth substrate by the pickup array 200 includes using electrostatic, Van der Waals forces or vacuum attraction. In some embodiments, the pickup array 200 lifts the light-emitting diode L from the growth substrate by Van der Waals forces, and the material of the pickup array 200 includes polydimethylsiloxane.

In some embodiments, the flux material layer 150b is sticky, and may assist the light-emitting diode L to be fixed and improve the contact between the light-emitting diode L and the first conductive material 140a. In some embodiments, the flux material layer 150b is sticky at a low temperature (e.g. 0 to 60° C.). Therefore, the light-emitting diode L may be stuck on the first conductive material 140a without the need to heat the flux material layer 150b. Since no additional heating is required, the pickup array 200 will not thermally expand when the light-emitting diode L is placed, and the alignment of the light-emitting diode L will not fail due to the mismatch between the thermal expansion coefficient of the pickup array 200 and the thermal expansion coefficient of the substrate 100.

Referring to FIG. 2F, the substrate 100 is heated to bring the flux material layer 150b to the softening temperature. The substrate 100 is heated to bring the first conductive material 140a to the melting temperature. The first conductive structure 140 and the flux structure layer 150 are formed after cooling. In some embodiments, the flux structure layer 150 includes a resin acid, an abietic resin, and a photosensitive polymer or a thermal curable polymer material. In some embodiments, the perpendicular projection area of the flux structure layer 150 on the substrate 100 is slightly smaller than the perpendicular projection area of the flux material layer 150b on the substrate 100. In some embodiments, after the flux material layer 150b is heated, a plurality of organic acids such as resin acids or abietic acids are derived. Such organic acids have activity able to dissolve and remove metal oxides at a high temperature, and is presented as an inactive solid acid at normal temperature and humidity, having a very good safety and reliability.

The first conductive structure 140 is electrically connected with the first electrode 310 of the corresponding light-emitting diode L. The first conductive structure 140 is electrically connected with the corresponding first contact pad P1.

The first electrode 310 is disposed between the first semiconductor layer 320 and the first contact pad P1. At least a portion of the first conductive structure 140 is disposed between the first contact pad P1 and the first electrode 310. The flux structure layer 150 at least partially surrounds the first conductive structure 140 and the light-emitting diode L in the projection direction perpendicular to the substrate 100. In other words, the orthographic projection of the flux structure layer 150 on the substrate 100 at least partially surrounds the orthographic projections of the first conductive structure 140 and the light-emitting diode L on the substrate 100. In this embodiment, a bottom surface BS of the light-emitting layer 330 of the light-emitting diode L contacts, for example, with a first surface of the first semiconductor layer 320, a top surface TS of the first electrode 310 contacts, for example, with a second surface of the first semiconductor layer 320. The flux structure layer 150 has a top portion TP, and the top portion TP of the flux structure layer 150 is higher than the top surface TS of the first electrode 310 and is lower than the bottom surface BS of the light-emitting layer 330. In some embodiments, the height difference X between the top portion TP of the flux structure layer 150 and the bottom surface BS of the light-emitting layer 330 relative to the substrate 100 is greater than 0.2 µm. In other words, the height difference X between the top portion TP of the flux structure layer 150 and the bottom surface BS of the light-emitting layer 330 in the direction PD perpendicular to the substrate 10 is greater than 0.2 µm so that the fixed adhesion effect of the light-emitting diode L is improved and the light extraction efficiency of the light-emitting diode L is not affected by the flux structure layer 150. Therefore, the light-emitting diode L has better light extraction efficiency.

Referring to FIG. 2G, a second conductive structure 120 is formed on the substrate 100. The second electrode 350 and the second conductive structure 120 are connected with each other, and the second electrode 350 is electrically connected with the second contact pad P2 by the second conductive structure 120. In this embodiment, the flux structure layer 150 and the second contact pad P2 do not overlap with each other in the projection direction perpendicular to the substrate 100. In other words, the orthographic projection of the flux structure layer 150 on the substrate 100 and the orthographic projection of the second contact pad P2 on the substrate 100 do not overlap with each other. Therefore, it is possible to prevent the flux material from remaining on the second contact pad P2 to further cause the problem that the second conductive structure 120 cannot be electrically connected with the second contact pad P2.

Figure 3:
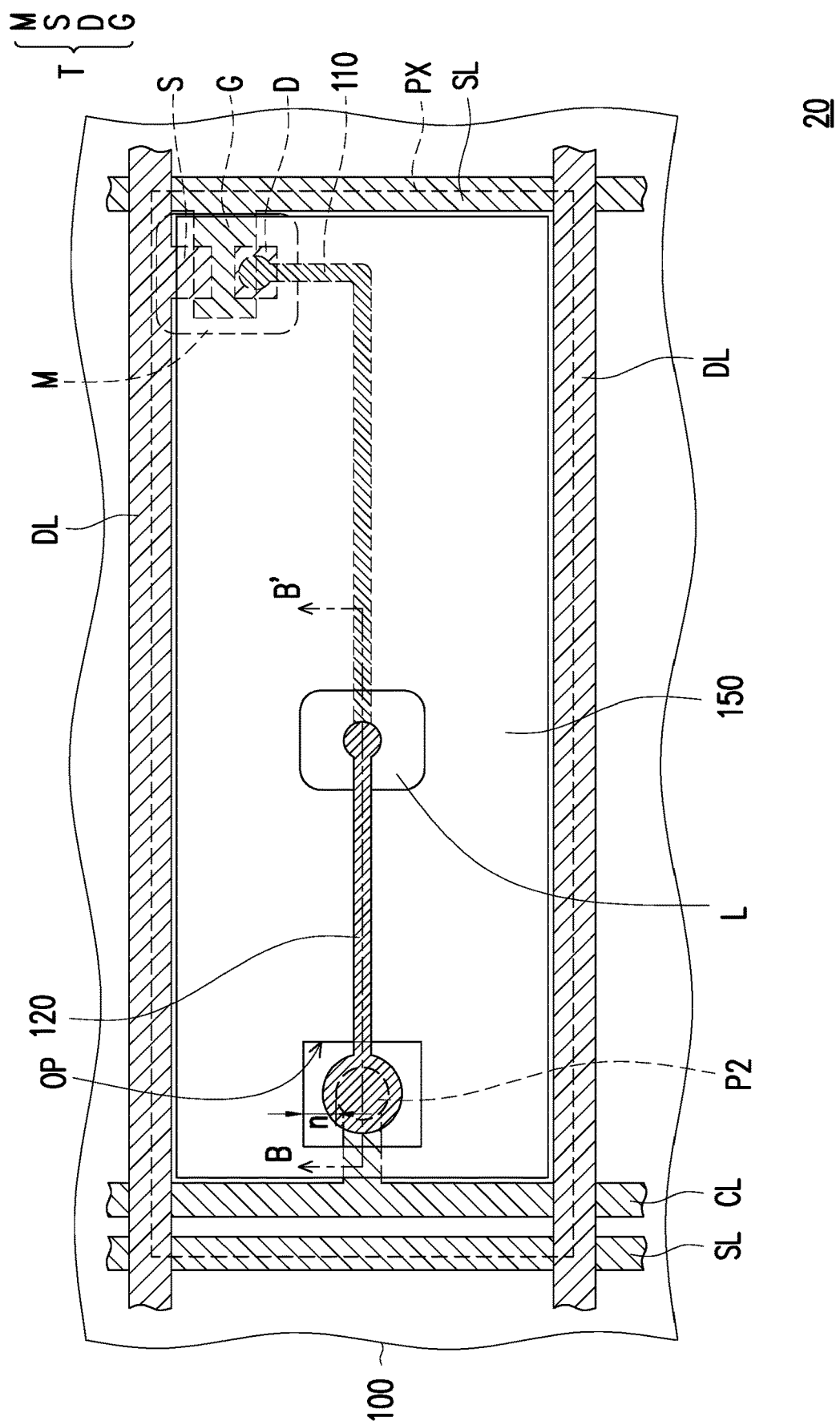
FIG. 3 is a schematic top view of a pixel array substrate according to an embodiment of the invention.

FIG. 3 is a schematic top view of a pixel array substrate according to an embodiment of the invention. It should be noted, the embodiment of FIG. 3 follows the reference numbers and some contents of the embodiment of FIG. 1, wherein the same or similar reference numbers are used to designate the same or similar elements, and the descriptions of the same technical contents are omitted. Reference may be made to the foregoing embodiments for the description of the omitted portions, and details are not repeated herein.

The difference between the embodiment of FIG. 3 and the embodiment of FIG. 1 is: in the pixel array substrate 20 in FIG. 3, the area of the flux structure layer 150 of the single sub-pixel region PX is larger. The flux structure layer 150 with this larger area can reduce the problem of light reflections in the pixel area and further improve the display quality and also may be served as a protective layer of the underlying elements.

In this embodiment, the flux structure layer 150 has an opening OP so as not to overlap with the second contact pad P2 in the projection direction perpendicular to the substrate 100. The second contact pad P2 has a first outer contour, and the opening OP of the flux structure layer 150 has a second outer contour. The shortest distance between the first outer contour and the second outer contour needs to be at least greater than 1 µm, thus avoiding the problem that the second contact pad P2 overlaps with the flux structure layer 150 due to process errors.

According to the embodiment of FIG. 3 and the embodiment of FIG. 1, the perpendicular projection area of one sub-pixel region PX on the substrate 100 is B, the perpendicular projection area of the flux structure layer 150 in the single sub-pixel region PX on the substrate 100 is A, wherein if the area A of the flux structure layer 150 is greater than 0.05B, the basic auxiliary fixing property of the flux structure layer 150 can be achieved. The larger the area of the flux structure layer 150, the better the effect of reducing the problem of light reflections in the pixel area. The flux structure layer 150 with this larger area may further improve the display quality and may also be served as a protective layer of the underlying elements. However, the problem that the second contact pad P2 overlaps with the flux structure layer 150 and the like due to process errors should be avoided so when the area A of the flux structure layer 150 is smaller than 0.916B, the overall benefit is better.

FIGS. 4A-4F are schematic cross-sectional views showing a manufacturing process of a pixel array substrate 30 according to an embodiment of the invention. The embodiment of FIGS. 4A-4F follows the reference numbers and some contents of the embodiment of FIGS. 2A-2G, wherein the same or similar reference numbers are used to designate the same or similar elements, and the descriptions of the same technical contents are omitted. Reference may be made to the foregoing embodiments for the description of the omitted portions, and details are not repeated herein.

Figure 4A:
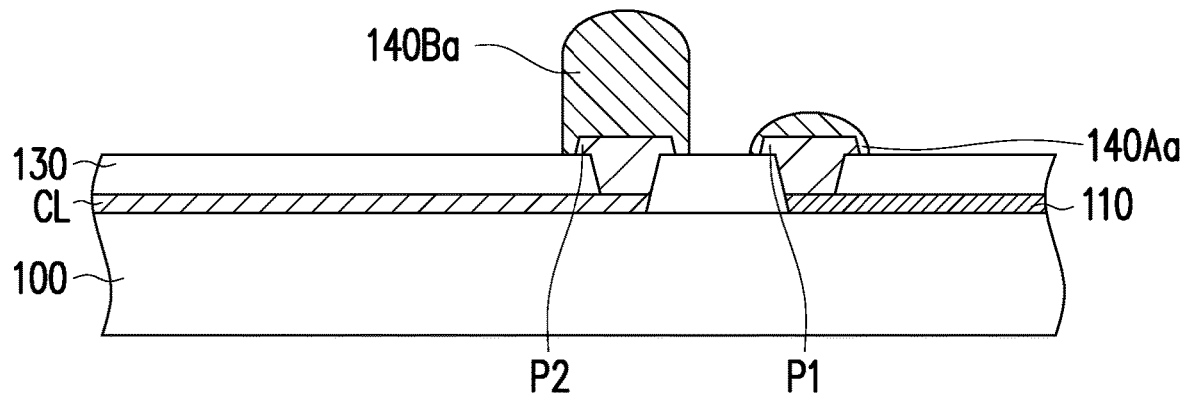
FIGS. 4A-4F are schematic cross-sectional views showing a manufacturing process of a pixel array substrate according to an embodiment of the invention.

Referring to FIG. 4A first, the first signal line 110 and the second signal line CL are disposed on the substrate 100, and an insulating layer 130 covers the first signal line 110 and the second signal line CL. The first signal line 110 and the second signal line CL are respectively electrically connected with the first contact pad P1 and the second contact pad P2 through the openings in the insulating layer 130.

A first conductive material 140Aa is separately formed on each of the first contact pads P1, and a second conductive material 140Ba is separately ft:wiled on each of the second contact pads P2. In some embodiments, the thickness of the second conductive material 140Ba is greater than the thickness of the first conductive material 140Aa. The methods of forming the first conductive material 140Aa and the second conductive material 140Ba includes, for example, solder plating, printing or other suitable methods. In some embodiments, the formation of the first conductive material 140Aa, and the formation of the second conductive material 140Ba are performed in the same step. The first conductive material 140Aa and the second conductive material 140Ba include, for example, the same material.

Figure 4B:
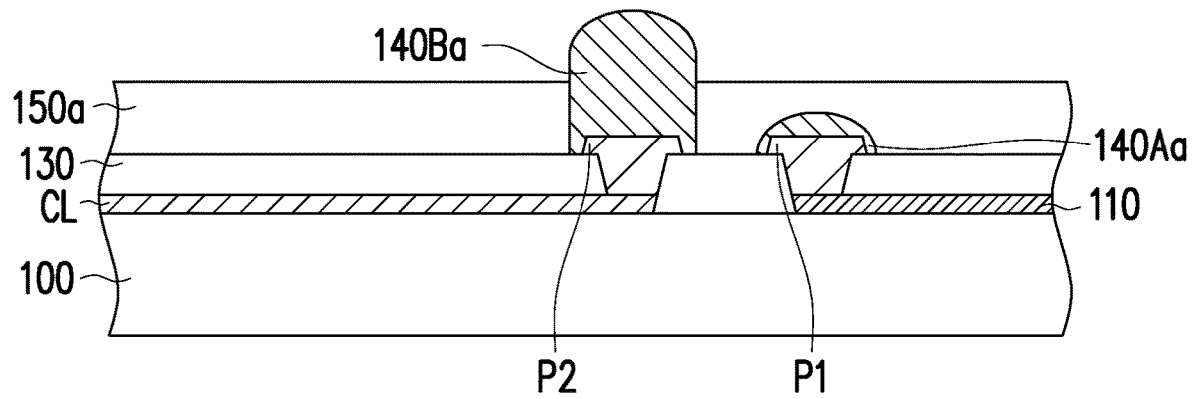

Referring to FIG. 4B, a flux material layer 150a is formed on the substrate 100, and the flux material layer 150a at least partially covers the first conductive material 140Aa. In this embodiment, the flux material layer 150a surrounds the sides of the second conductive material 140Ba, and exposes at least a portion of the upper surface of the second conductive material 140Ba. In addition, in some embodiments, the flux material layer 150a may also be adjacent to the second conductive material 140Ba without covering the second conductive material 140Ba. The softening temperature of the flux material layer 150a is lower than the melting temperature of the first conductive material 140Aa and the second conductive material 140Ba. In this embodiment, the thickness of the flux material layer 150a is smaller than the thickness of the second conductive material 140Ba, but the invention is not limited thereto. In some embodiments, the thickness of the flux material layer 150a is greater than the thickness of the second conductive material 140Ba.

Figure 4C:
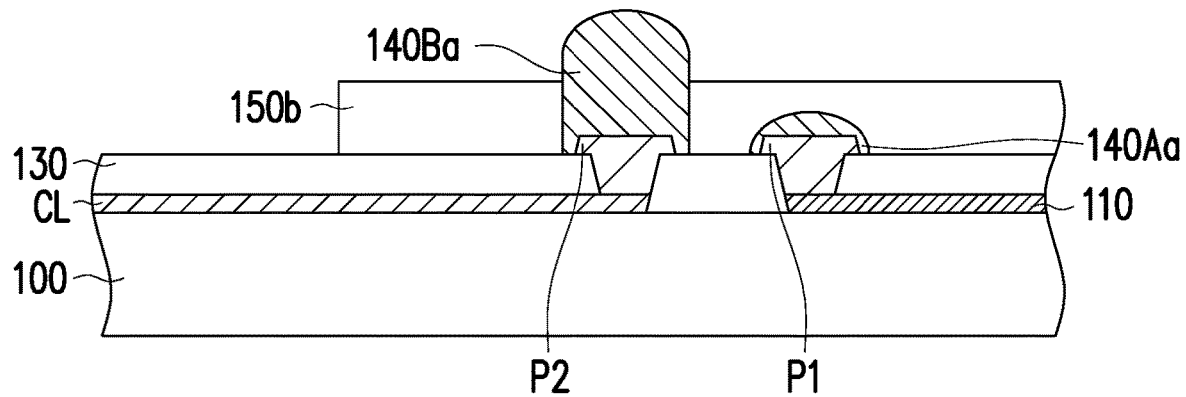

Referring to FIG. 4C, a patterning process is performed on the flux material layer 150a. In some embodiments, the method of performing the patterning process on the flux material layer 150a includes a lithography process and an etching process, but the invention is not limited thereto. In some embodiments, the flux material layer 150a includes a photosensitive polymer material, and the flux material layer 150a can be patterned with only a lithography process.

Figure 4D:
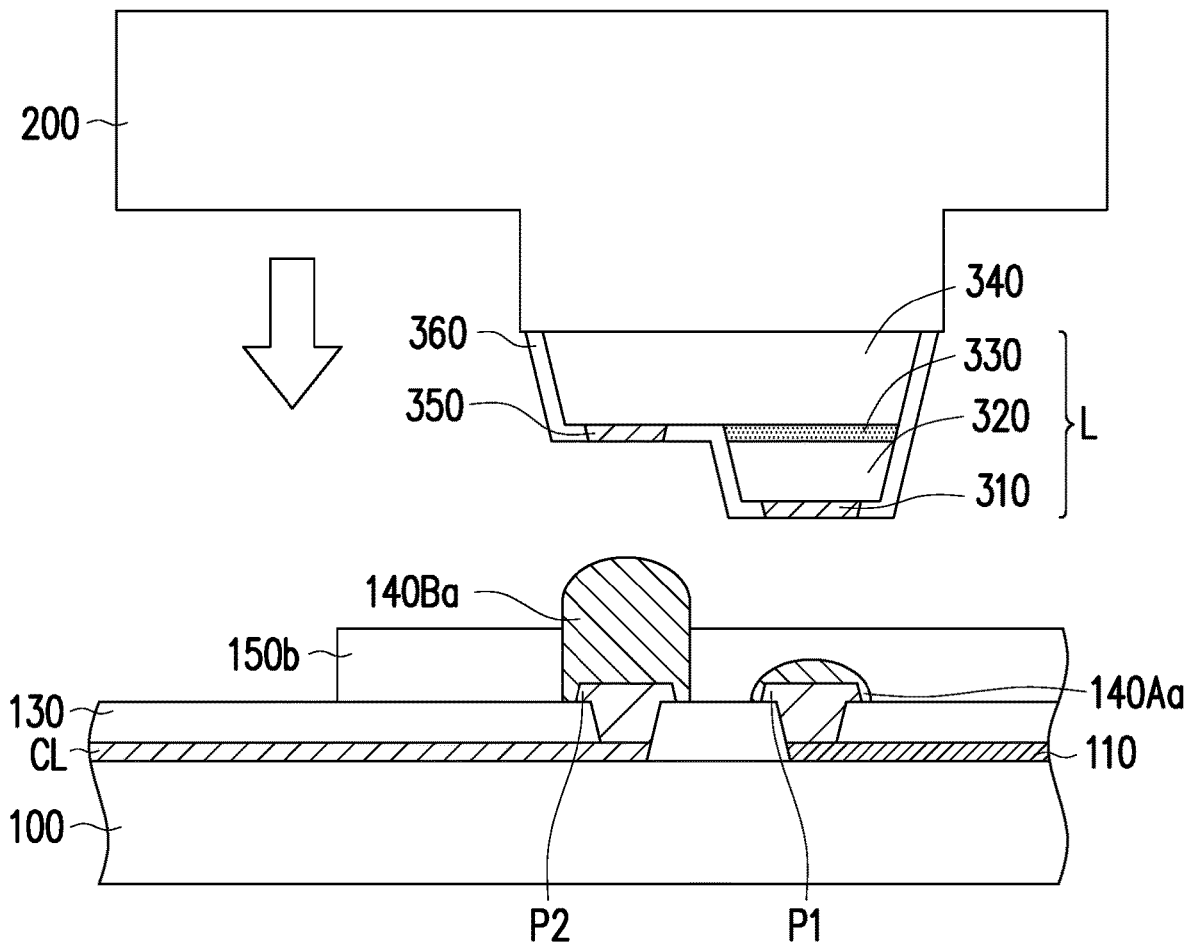
Figure 4E:
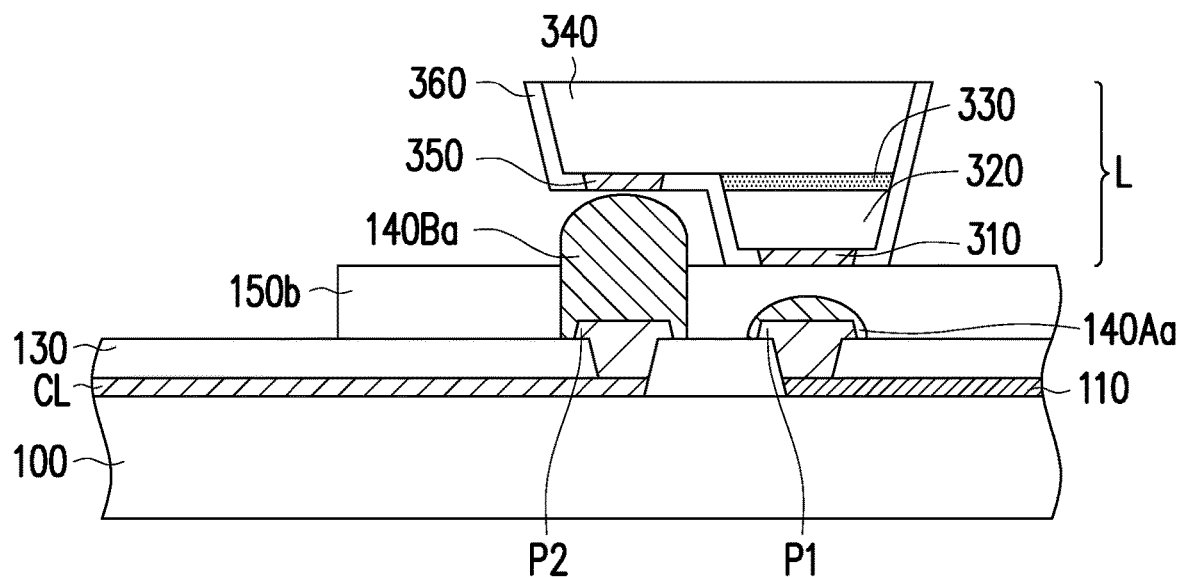

Referring to FIG. 4D and FIG. 4E, a plurality of the light-emitting diodes L are disposed on the flux material layer 150b. The light-emitting diode L includes a first electrode 310, a first semiconductor layer 320, a light-emitting layer 330, a second semiconductor layer 340, and a second electrode 350. The first electrode 310 is disposed on the first semiconductor layer 320. The light-emitting layer 330 is disposed between the first semiconductor layer 320 and the second semiconductor layer 340. The second electrode 350 is disposed on the second semiconductor layer 340, and the second electrode 350 and the light-emitting layer 330 are disposed on the same surface of the second semiconductor layer 340 and separated from each other. Therefore, in this embodiment, the first electrode 310 and the second electrode 350 are disposed on the same side of the light-emitting diode L and separated from each other. An insulating layer 360 covers the sides of the first semiconductor layer 320, the light-emitting layer 330, and the second semiconductor layer 340. The first electrode 310, and the second electrode 350 of the light-emitting diode L respectively correspond to the first conductive material 140Aa on the first contact pad P1 and the second conductive material 140Ba on the second contact pad P2.

In this embodiment, the light-emitting diode L is, for example, formed on a growth substrate (not shown). Next, the light-emitting diode L is lifted from the growth substrate by a pickup array 200, and then is transposed on the first contact pad P1. In some embodiments, after the light-emitting diode L is lifted from the growth substrate, and before the light-emitting diode L is transposed on the first contact pad P1, the light-emitting diode L may be transposed on the first contact pad P1 after the light-emitting diode L is transposed on other transitional substrates. In some embodiments, the method of lifting the light-emitting diode L from the growth substrate by the pickup array 200 includes using electrostatic, Van der Waals forces or vacuum attraction. In some embodiments, the pickup array 200 lifts the light-emitting diode L from the growth substrate by Van der Waals forces, and the material of the pickup array 200 includes polydimethylsiloxane.

In some embodiments, the flux material layer 150b is sticky, and may assist the light-emitting diode L to be fixed and improve the adhesion between the light-emitting diode L and the first conductive material 140Aa. In other words, the light-emitting diode L may first be temporarily adhered and fixed above the first conductive material 140Aa, wherein the fixation is not limited to being completely fixed, but may also be a state in which it is relatively less likely to slide.

Figure 4F:
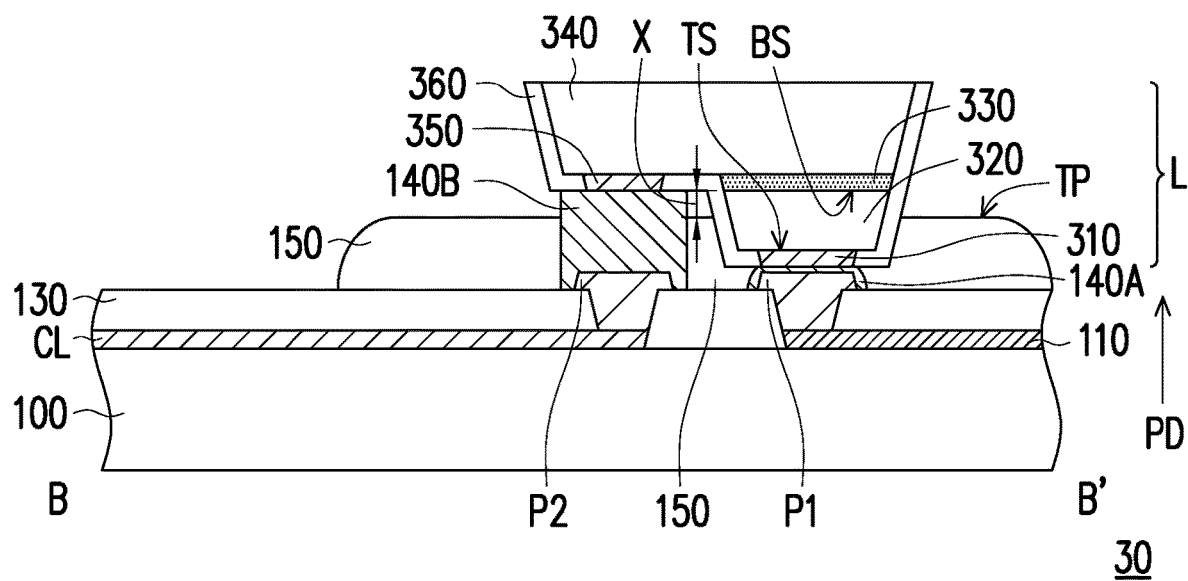

Referring to FIG. 4F, the substrate 100 is heated to bring the flux material layer 150b to the softening temperature. The substrate 100 is heated to bring the first conductive material 140Aa and the second conductive structure 140Ba to the melting temperature. The first conductive structure 140A, the second conductive structure 140B and the flux structure layer 150 are formed after cooling. In some embodiments, the flux structure layer 150 includes a resin acid, an abietic resin, and a photosensitive polymer or a thermal curable polymer material. In some embodiments, the area of the flux structure layer 150 is slightly smaller than the area of the flux material layer 150b. A portion of the flux structure layer 150 is formed between the first conductive material 140Aa (or the first conductive structure 140A) and the second conductive material 140Ba (or the second conductive structure 140B), and may further prevent short-circuiting between the first conductive structure 140A connected with the first contact pad P1 and the second conductive structure 140B connected with the second contact pad P2.

The first conductive structure 140A is electrically connected with the first electrode 310 of the corresponding light-emitting diode L and the first contact pad P1. The first conductive structure 140A is, for example, directly connected with the first electrode 310. The second conductive structure 140B is electrically connected with the second electrode 350 of the corresponding light-emitting diode L and the second contact pad P2. The second conductive structure 140B is, for example, directly connected with the second electrode 350.

The first electrode 310 is disposed between the first semiconductor layer 320 and the first contact pad P1. The second electrode 350 is disposed between the second semiconductor layer 340 and the second contact pad P2. At least a portion of the first conductive structure 140A is disposed between the first contact pad P1 and the first electrode 310. At least a portion of the second conductive structure 140B is disposed between the second contact pad P2 and the second electrode 350.

The flux structure layer 150 at least partially surrounds the first conductive structure 140A, the second conductive structure 140B and the light-emitting diode L in the projection direction perpendicular to the substrate 100. In other words, the orthographic projection of the flux structure layer 150 on the substrate 100 at least partially surrounds the orthographic projections of the first conductive structure 140A, the second conductive structure 140B and the light-emitting diode L on the substrate 100. In this embodiment, a bottom surface BS of the light-emitting layer 330 of the light-emitting diode L contacts, for example, with a first surface of the first semiconductor layer 320, and a top surface TS of the first electrode 310 contacts, for example, with a second surface of the first semiconductor layer 320. The flux structure layer 150 has a top portion TP, and the top portion TP is higher than the top surface TS of the first electrode 310 and is lower than the bottom surface BS of the light-emitting layer 330. In some embodiments, the height difference X between the top portion TP of the flux structure layer 150 and the bottom surface BS of the light-emitting layer 330 relative to the substrate 100 is greater than 0.2 μm. In other words, the height difference X between the top portion TP of the flux structure layer 150 and the bottom surface BS of the light-emitting layer 330 in the direction PD perpendicular to the substrate 10 is greater than 0.2 μm so that the fixed adhesion effect of the light-emitting diode L is improved and the light extraction efficiency of the light-emitting diode L is not affected by the flux structure layer 150. Therefore, the light-emitting diode L has better light extraction efficiency.

To sum up, the pixel array substrate in some embodiments of the invention can increase the probability that the light-emitting diodes are electrically connected with the contact pads correctly and maintain good light extraction efficiency. The pixel array substrate in some embodiments of the invention can reduce the problem of light reflections in the pixel area and further improve the display quality.

The pixel array substrate in some embodiments of the invention can prevent the flux material layer from remaining on the contact pads that may further cause the problem that the contact pads is not electrically connected with the conductive structure. The pixel array substrate in some embodiments of the invention can pattern the flux material layer without an additional etching process.

Although the disclosure has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A pixel array substrate, having a plurality of sub-pixel regions, wherein a pixel structure of an individual sub-pixel region of the plurality of sub-pixel regions comprises:
   a first signal line and a second signal line disposed on a substrate;
   a first contact pad and a second contact pad respectively electrically connected with the first signal line and the second signal line;
   a light-emitting diode disposed on the first contact pad, the light-emitting diode comprising:
      a first semiconductor layer and a second semiconductor layer;
      a light-emitting layer disposed between the first semiconductor layer and the second semiconductor layer; and
      a first electrode disposed between the first semiconductor layer and the first contact pad,
   a first conductive structure of which at least a portion is disposed between the first contact pad and the first electrode; and
   a flux structure layer at least partially surrounding the first conductive structure and the light-emitting diode in a projection direction perpendicular to the substrate, wherein the flux structure layer has a top portion, and the top portion is higher than a top surface of the first electrode and is lower than a bottom surface of the light-emitting layer,
   wherein the flux structure layer has an opening corresponding to the second contact pad, the second contact pad has a first outer contour, the opening of the flux structure layer has a second outer contour, and there is a shortest distance between the first outer contour and the second outer contour, the shortest distance is greater than 1 μm.

2. The pixel array substrate according to claim 1, wherein there is a height difference between the top portion of the flux structure layer and the bottom surface of the light-emitting layer relative to the substrate, and the height difference is greater than 0.2 μm.

3. The pixel array substrate according to claim 1, wherein the flux structure layer does not overlap with the second contact pad in the projection direction perpendicular to the substrate.

4. The pixel array substrate according to claim 1, wherein a range of the individual sub-pixel region of the plurality of sub-pixel regions is defined by two adjacent scan lines having the same function and two adjacent data lines having the same function, the scan lines and the data lines respectively extend along different directions, and the scan lines are parallel to the second signal line.

5. The pixel array substrate according to claim 4, wherein a perpendicular projection area of the individual sub-pixel region on the substrate is B, a perpendicular projection area of the flux structure layer of the individual sub-pixel region on the substrate is A, 0.05B<A<0.916B.

6. The pixel array substrate according to claim 1, wherein each of light-emitting diodes further comprises:
   a second electrode disposed on a side of the second semiconductor layer opposite to the light-emitting layer and the second semiconductor layer is disposed between the second electrode and the light-emitting layer, wherein the second electrode is electrically connected with the second contact pad.

7. The pixel array substrate according to claim 1, wherein each of light-emitting diodes further comprises:
   a second electrode disposed on the second semiconductor layer, wherein the second electrode is connected with a second conductive structure, and the second electrode is electrically connected with the second contact pad, wherein the first conductive structure and the second conductive structure are disposed on the same side of the light-emitting diode and separated from each other.

8. The pixel array substrate according to claim 7, wherein the flux structure layer at least partially surrounds the second conductive structure so that a portion of the flux structure layer is disposed between the first conductive structure and the second conductive structure.

9. The pixel array substrate according to claim 1, wherein the flux structure layer comprises a resin acid, an abietic resin, and a photosensitive polymer or a thermal curable polymer material.

* * * * *